(12) United States Patent  (10) Patent No.: US 8,234,607 B2
Ekanayake et al.  (45) Date of Patent: Jul. 31, 2012

(54) TOKEN ENHANCED ASYNCHRONOUS CONVERSION OF SYNCHONOUS CIRCUITS

(75) Inventors: Virantha Ekanayake, San Jose, CA (US); Clinton W. Kelly, San Jose, CA (US); Rajit Manohar, Ithaca, NY (US); Christopher LaFrieda, Brooklyn, NY (US); Gael Paul, Aix-en-Provence (FR); Raymond Nijssen, San Jose, CA (US); Marcel Van der Goot, Pasadena, CA (US)

(73) Assignee: Achronix Semiconductor Corporation, Santa Clara, CA (US)

( * ) Notice: Subject to any disclaimer, the term of this patent is extended or adjusted under 35 U.S.C. 154(b) by 218 days.

(21) Appl. No.: 12/559,612

(22) Filed: Sep. 15, 2009

(65) Prior Publication Data

US 2011/0066986 A1    Mar. 17, 2011

(51) Int. Cl.
*G06F 9/45* (2006.01)
(52) U.S. Cl. ........ 716/103; 716/101; 716/102; 716/106; 716/107; 716/134

(58) Field of Classification Search .................. 716/101, 716/102, 103, 104, 107, 132–135
See application file for complete search history.

(56) References Cited

U.S. PATENT DOCUMENTS

| 7,584,449 | B2 * | 9/2009 | Beerel et al. ................... 716/104 |
| 7,701,254 | B2 * | 4/2010 | Chow et al. ....................... 326/93 |
| 7,913,007 | B2 * | 3/2011 | Singh et al. ..................... 710/105 |
| 2004/0158806 | A1 * | 8/2004 | Scheffer ............................ 716/11 |
| 2005/0077918 | A1 * | 4/2005 | Teifel et al. ....................... 326/41 |
| 2005/0160392 | A1 * | 7/2005 | Sandbote .......................... 716/18 |
| 2008/0228951 | A1 * | 9/2008 | Chow et al. ...................... 710/10 |
| 2009/0210847 | A1 * | 8/2009 | Manohar et al. ................. 716/12 |
| 2009/0217232 | A1 * | 8/2009 | Beerel et al. ..................... 716/18 |
| 2009/0288058 | A1 * | 11/2009 | Shiring et al. ................... 716/18 |

* cited by examiner

*Primary Examiner* — Thuan Do
*Assistant Examiner* — Nha Nguyen
(74) *Attorney, Agent, or Firm* — Schwegman, Lundberg & Woessner, P.A.

(57) ABSTRACT

A synchronous circuit design is converted to an asynchronous circuit by converting synchronous circuit logic to an asynchronous circuit logic, and one or more additional tokens into the converted asynchronous circuit. The circuit is initialized with a desired additional number of tokens placed in the asynchronous circuit, or a desired number of tokens are inserted at an input before taking tokens from an output.

10 Claims, 2 Drawing Sheets

TOKEN ENHANCED ASYNCHRONOUS CONVERSION OF SYNCHONOUS CIRCUITS

FIELD OF THE INVENTION

The invention relates generally to conversion between synchronous and asynchronous circuit models, and more specifically in one embodiment to a token enhanced conversion of synchronous circuits to asynchronous circuits.

BACKGROUND

Design of large or complex electronic circuits such as the integrated circuits found in computers, consumer electronics devices, and other such electronic devices is almost universally done using computerized design software. The design software enables the designer to represent various components such as logic gates, registers, and switches using elements representing these functions in the design software, reducing the need for the designer to work with each individual transistor or other element that makes up these standard logic elements.

Hardware Description Languages (HDLs) such as VHDL (Very High Speed Integrated Circuit HDL) provide not only design and layout functionality, but often can simulate operation of a circuit as well. Clocked logic circuits having clocks that define when each element such as a register or latch reads and evaluates input signals can be simulated by stepping through time using discrete clock cycles and tracking the flow of data between elements and operation of the interconnected logic elements at each clock cycle, providing a way to test and optimize designs before building the actual circuitry.

Such clocked, or synchronous circuits, are the building blocks upon which many digital electronic devices are constructed. But, factors such as clock management and skew, power consumption, speed limited by an element's slowest possible function, and other challenges with synchronous circuit design have renewed an interest in asynchronous circuits, which can operate more efficiently in many applications.

Asynchronous circuits do not operate based in the time domain, or on fixed clock timing, but operate in the event domain and are triggered by observation of events. When updated input data is received in an asynchronous digital logic circuit element, the receiving element can update its state based on the input without waiting for a clock. More complex asynchronous logic elements are further able to receive a control signal requesting an action be performed, and send a confirmation that the action is complete. This enables event signals to be passed between asynchronous circuit elements, in addition to the logic data upon which the elements operate.

Asynchronous circuits can also be used to implement circuits originally designed using synchronous circuit elements, by conversion of synchronous to asynchronous elements such as is described in greater detail in "Systems and Methods for Performing Automated Conversion of Representations of Synchronous Circuit Designs To and From Representations of Asynchronous Circuit Designs", pending as U.S. patent application no. US2007/0256038. But, significant challenges remain, including how to most efficiently process data within the asynchronous circuit architecture replacing the original synchronous circuit.

SUMMARY

One example embodiment of the invention comprises converting a synchronous circuit design to an asynchronous circuit by converting synchronous circuit logic to an asynchronous circuit logic, and inserting one or more additional tokens into the converted asynchronous circuit. In further examples, the circuit is initialized with a desired additional number of tokens placed in the asynchronous circuit, or a desired number of tokens are inserted at an input before taking tokens from an output.

DETAILED DESCRIPTION

Figure 1:
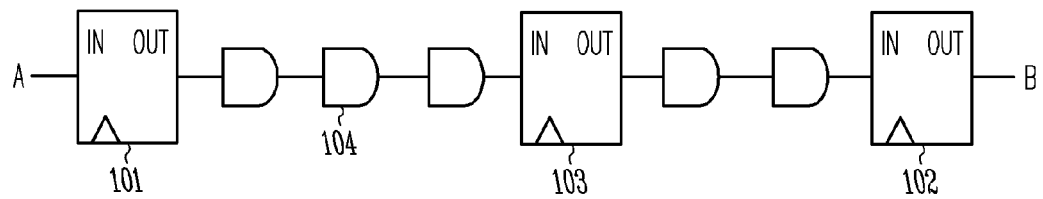
FIG. 1 shows an example synchronous circuit design, consistent with an example embodiment of the invention.

In the following detailed description of example embodiments of the invention, reference is made to specific examples by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit the invention as a whole, and any reference to the invention, its elements, operation, and application do not limit the invention as a whole but serve only to define these example embodiments. The following detailed description does not, therefore, limit the scope of the invention, which is defined only by the appended claims.

Synchronous digital logic circuit designs are traditionally represented using a variety of hardware description languages, higher level description languages, netlists, and schematics. These representations are synchronous representations in that they define the functionality of the circuits in the presence of a clock signal or with a master timing signal used to synchronize operations.

But, asynchronous circuitry that is able to complete operations and pass on results as soon as complete have a variety of advantages in certain applications over synchronous circuitry, including factors such as clock management and skew, power consumption, and ability to take advantage of varying function speeds. A clock distributed across a large circuit operating at high speed will not reach all parts of the circuit at the same time, and so clock skew or phase must be managed in high-performance synchronous circuits to ensure that all parts of the circuit are operating in lock-step as designed. Power consumption is affected by the need to distribute a clock throughout the entire circuit every cycle, as well as the need to constantly drive clock buffers, latches, and combinational logic even when no useful work is being performed. Synchronous circuit elements are also constrained in that a synchronous circuit must wait the longest possible time a logic unit could take to produce a result, whether or not a result is produced more quickly in a given operation.

To utilize an asynchronous architecture to implement a circuit originally laid out as a synchronous circuit, the synchronous representation must be translated into an asynchronous representation. To accomplish this goal, there are two fundamental approaches. First, redesign the circuit using an asynchronous representation, or second, convert the existing synchronous representation into an asynchronous representation.

Redesigning the circuit as in the first approach is time intensive and involves re-implementing an entire design for execution in an asynchronous architecture. This is an approach that is not acceptable to designers as it is costly in terms of time and requires that designers learn a completely new way to represent circuit designs.

The second approach of converting the synchronous circuit to an asynchronous circuit is therefore many times preferred as it does not require that the designer have any knowledge of asynchronous circuit architecture.

Some converted asynchronous designs that are derived from synchronous designs not having sufficient registers will not have a sufficient number of tokens in the asynchronous circuit to operate near the highest practical throughput. If the asynchronous circuit pipeline is not sufficiently filled, processing capacity is underutilized in the asynchronous circuit.

While methods for translating a fully synchronous design into an asynchronous design have been discussed elsewhere, such as in "Systems and Methods for Performing Automated Conversion of Representations of Synchronous Circuit Designs To and From Representations of Asynchronous Circuit Designs", pending as U.S. patent application no. US2007/0256038, the method described there does not provide for improving utilization of asynchronous circuit pipeline elements, such as by increasing the number of tokens in the system from what conversion of synchronous registers would otherwise provide.

A method for translation of a synchronous design having asynchronous inputs into a fully asynchronous design, while preserving the illusion of synchrony on the boundary is therefore provided here, as demonstrated by the examples below. The method in various embodiments can be applied to a complete synchronous circuit, or to part of a synchronous circuit thereby enabling it to handle complex synchronous designs having clock gating, multiple clock domains, or other advanced features.

One example embodiment of the invention comprises converting a synchronous circuit design to an asynchronous circuit by converting synchronous circuit logic to an asynchronous circuit logic, and inserting one or more additional tokens into the converted asynchronous circuit. In further examples, the circuit is initialized with a desired additional number of tokens placed in the asynchronous circuit, or a desired number of tokens are inserted at an input before taking tokens from an output.

In converting a synchronous circuit to an asynchronous circuit, the inputs include a circuit description such as a synchronous circuit netlist, with additional auxiliary information that is normally provided for synthesis. This information includes the set of clocks and their frequencies (in the case of one clock signal, the frequency is not necessarily required), the set of multi-cycle paths (if any), and any constraints on input and output signals with respect to the appropriate clocks. In addition, any signals that must be kept synchronous are also specified. By default, the algorithm assumes that all primary inputs and outputs are synchronous.

A synchronous netlist contains a set of gates that are combinational logic, and another set of gates that are state-holding. The state-holding gates hold the results of a previous cycle of combinational logic during the clock cycle or cycles it serves as inputs to the next combinational logic stage. In this example we consider four types of state-holding gates: positive edge-triggered flip-flops (PFLOPs), negative edge-triggered flip-flops (NFLOPs), latches that are transparent when their clock input is high (PLATCH), and latches that are transparent when their clock input is low (NLATCH). Because synthesis tools can eliminate generated clocks and replace them with combinations of clocks and clock enables, for simplicity we here assume that all clock signals used by state-holding elements are primary clock inputs to the circuit.

The synchronous netlist is converted to an asynchronous format using the synchronous to asynchronous conversion method described in the above-referenced published patent application. This asynchronous implementation is equivalent to the synchronous one in that it performs the same computations or logical functions. This conversion example further includes a method for generating annotations that translate the performance characteristics of the asynchronous implementation back into the synchronous domain using an annotation generator.

The target asynchronous netlist represents circuits that can be implemented efficiently as fine-grained asynchronous pipelines, and can be represented as an asynchronous dataflow graph. Nodes in the dataflow graph operate on data values, referred to as tokens. A token is a data item that can flow through an asynchronous pipeline, and can be a one-bit value or a multi-bit value. Operators in the dataflow graph receive tokens on their inputs and produce tokens on their outputs. The change in the value of the token is used to compute results. Connectivity between operators is specified by arrows that correspond to communication channels along which tokens can be sent and received. Communication channels in this example have no buffering, and sending and receiving a token on a channel corresponds to rendezvous synchronization.

The synchronous to asynchronous conversion algorithm maps a synchronous netlist into an asynchronous dataflow graph that performs the same computation. Each signal is mapped to an edge in the dataflow graph, and the different gates from the synchronous netlist are translated into dataflow operators.

The previously disclosed method is therefore centered around the correspondence between tokens and clock edges. For each clock domain, the value of a signal during clock cycle number k corresponds to the value of the asynchronous data token on the corresponding asynchronous channel that has sequence number k. (In the presence of clock gating, this relationship is slightly more complicated and involves knowing when the clock domain is in fact gated.) In what follows, we refer to asynchronous signals being part of a clock domain when their corresponding synchronous signals were in the specified domain.

It can happen that a given synchronous representation of a circuit does not have sufficient pipelining or registers to achieve a high throughput in the converted asynchronous representation. Although the converted asynchronous system is still functionally equivalent to the synchronous system, part of the pipeline may be idle for lack of data tokens in the converted asynchronous circuit, and thus the system will not be able to take advantage of the full throughput available.

Although one could increase the pipelining by retiming the original system, by inserting additional registers, and redistributing the combinational logic among the new registers, this is a difficult problem to automate as adding or removing registers in a synchronous design can change the logical structure (state-encoding) of the original circuit. Retiming also has the added drawback of making debugging and verification of the retimed system even more difficult.

Instead of retiming the original synchronous system, one example method for increasing the performance presented here operates on the converted asynchronous representation.

FIG. 1 illustrates an example synchronous circuit path, as may be used in an example embodiment of the invention. Here, a primary input a and primary output b are shown, with three registers having combinational logic between them. More specifically, input register 101 and output register 102 have a single register 103 between them, along with various combinational logic elements 104.

Figure 2:
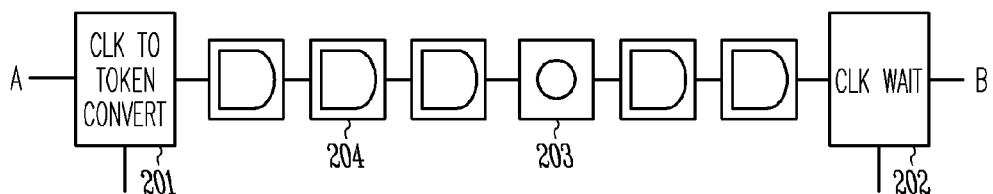
FIG. 2 shows conversion of the synchronous circuit of FIG. 1 to an asynchronous circuit, consistent with an example embodiment of the invention.

This example synchronous circuit is converted to an asynchronous circuit as shown in FIG. 2, consistent with an example embodiment of the invention. The primary input 201 and output 202 have converter blocks that convert between synchronous clocked signals and asynchronous data tokens, and the combinational logic and synchronous registers of FIG. 1 are represented with dataflow elements implemented using asynchronous pipeline elements. The single register or flip-flop 103 in the middle of the combinational logic circuit of FIG. 1 is represented by token 203, which is similarly the only token held in the combinational logic network elements 204 between the input 201 and output 202.

In operation, at each clock tick primary input a is converted into a data token and injected into the asynchronous pipeline by the input 201 at the left. Simultaneously, the token inside the asynchronous pipeline is taken out of the system and converted into a synchronous signal at the primary output b as shown at 202. Note that for any single clock period, there is only a single token inside the asynchronous pipeline, because we are removing tokens at the outputs at the same rate as we are inserting tokens at the input, in accordance with our conversion process for maintaining one-to-one correspondence with the original synchronous system. For correct operation, the minimum time between clock ticks at the boundary, or in other words, the clock period, is determined by the maximum physical propagation time (tL) of the single token in the system from the input at the left to the output at the right.

This tL can be determined by well-known timing analysis algorithms, and its inverse 1/tL reported back, as the achievable frequency in the original synchronous system. The method presented here of improving the throughput or frequency of such a system involves increasing the number of tokens present in the system.

Figure 3:
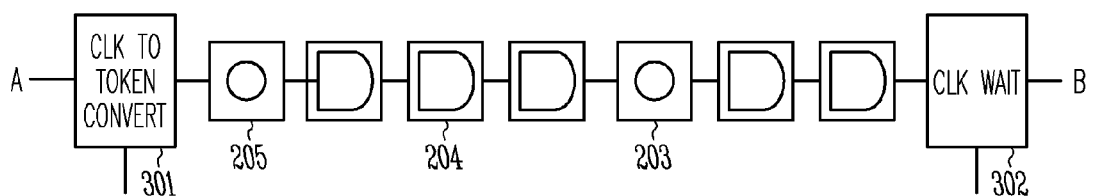
FIG. 3 shows addition of a token to the converted asynchronous circuit design of FIG. 2, consistent with an example embodiment of the invention.

FIG. 3 shows an example asynchronous version of the circuit of FIG. 1 with an additional token beyond FIG. 2, consistent with an example embodiment of the invention. Here, input 301 and outputs 302 are similar to the input 201 and output 202 of FIG. 2, except that the inputs and outputs manage multiple tokens in flight in the asynchronous logic network 204 at the same time. Token points 203 and 205 are now both located at different points in the asynchronous combinational logic pipeline, reducing the amount of logic that must be performed at each clock cycle. The clock speed can therefore be sped up, such as operating at twice the rate, with the inputs and outputs each handling two tokens per clock cycle.

When the system is operating, each new token that gets injected at the left now has two full clock periods before it needs to arrive at the right edge, and be clocked out on the primary output b. Thus, each token only needs to travel an average of tL/2 per clock period, allowing the system to be clocked at a frequency of 2/tL at the boundaries, and effectively doubling the frequency of the system. This extra token insertion is in effect adding extra pipelining, and the number of extra tokens added is here denoted as xp. For the example above, xp=1.

As a side-effect of this extra token insertion, the primary output on b corresponding to the extra token will no longer correspond to that produced by the original synchronous system in that single cycle, as there is usually no way to determine what the first value on a will be a priori. However, almost no synchronous designer relies on a circuit's output values on the first few cycles, because any system will usually require many cycles of reset being asserted to stabilize and start operating correctly. Therefore, the insertion of extra tokens that may cause the outputs to differ from that of the synchronous system on the first few cycles will have no adverse effect on the overall correctness of the system.

In addition to the method shown above of inserting tokens explicitly into the dataflow graph, we can also add the ability for each asynchronous pipeline stage, or a subset of them, to optionally initialize with a token, as is well-known in the art. However, both such methods result in modifying the dataflow graph corresponding to the converted asynchronous system, which may not always be desirable.

We use this method which leaves a given dataflow graph untouched in a further example, still allowing us to effectively insert tokens into the system. At the primary outputs of the system, at the start of operation, we can wait a number of clock ticks equal to xp before taking data tokens out of the system. During these xp clock ticks, the primary input converters will have inserted an xp number of tokens into the system that increase as required the occupancy of the pipelines.

Figure 4:
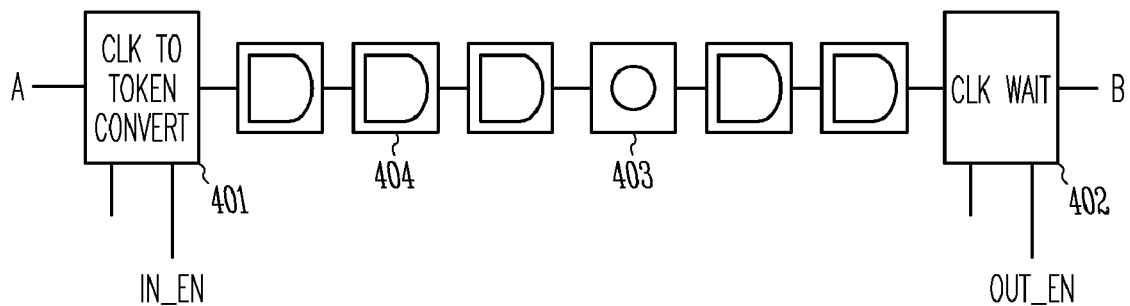
FIG. 4 shows addition of input and output enable signals to insert additional tokens into the asynchronous design of FIG. 2, consistent with an example embodiment of the invention.

A simple modification to the converters that can be used to implement this method is shown in FIG. 4, consistent with an example embodiment of the invention. The input converter 401 on a now has an enable signal called in_en that is asserted synchronously with the clock. Once in_en is asserted, the converter 401 will start converting a into data tokens and injecting them into the asynchronous pipeline.

Correspondingly, the output converter 402 on b also has an enable signal called out_en that is also asserted synchronously with the clock. Once out_en is asserted, the converter will start taking data tokens out of the asynchronous pipeline and sending the value on b. By setting in_en to be asserted xp number of clock cycles before out_en, we can ensure that we are getting valid data out of the asynchronous network while leaving the desired number of tokens in flight.

This can be done in a variety of ways, such as using a counter or set of counters in the synchronous domain that are programmed with the xp value. Although the input converters do not necessarily require the enabling signal in_en to implement this xp delay, such a signal is useful in practice when enabling multiple individual converters.

Figure 5:
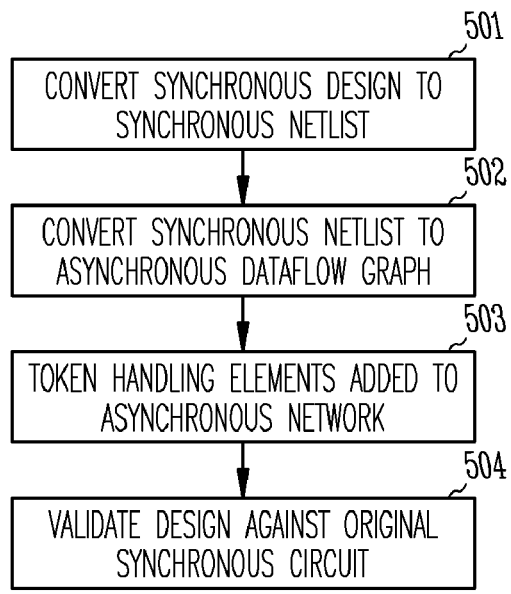
FIG. 5 is a flowchart illustrating a method of converting a synchronous circuit to an asynchronous circuit, consistent with an example embodiment of the invention.

FIG. 5 is a flowchart illustrating a method of converting a synchronous circuit to an asynchronous circuit, consistent with an example embodiment of the invention. At 501, a synchronous circuit design is converted to a synchronous netlist. The synchronous netlist is converted to an asynchronous dataflow graph at 502, and additional token handling elements are inserted into the network at 503 enabling handling of a greater number of tokens in flight. A boundary is created around the input/output borders of the synchronous design for the synchronous or clocked inputs and outputs at 504. At 505, the timing of the asynchronous dataflow graph and boundary inputs and outputs are validated against the requirements of the original synchronous circuit representation.

A software tool that implements methods such as these to convert a synchronous logic circuit to an asynchronous circuit having enhanced token placement increases the versatility of asynchronous circuits without requiring that a circuit designer learn asynchronous circuit design techniques or abandon synchronous hardware description languages. A designer can create a circuit having synchronous and asynchronous inputs and outputs, and use asynchronous conversion tools implementing methods such as the examples presented above to create an asynchronous implementation of the synchronous circuit. For example, such a tool can expand the versatility of an asynchronous Field Programmable Gate Array (FPGA) that is used to implement traditional synchronous designs by facilitating faster and more efficient operation of the converted asynchronous circuit having added tokens.

The example embodiments of the invention presented here enable designers that are using asynchronous logic circuits such as Achronix's FPGAs to optimize the performance of their design without having to understand the details of asynchronous circuits. In other words, designers can stay in the synchronous domain both for design entry as well as performance optimization, while implementing the design efficiently in asynchronous logic.

The examples given here illustrate how the number of tokens in flight can be increased in an asynchronous circuit converted from a synchronous circuit design, improving utilization of the asynchronous circuit pipeline. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A method of converting a synchronous circuit to an asynchronous circuit, comprising:
   converting synchronous circuit logic to asynchronous circuit logic by using a computer;
   inserting one or more additional tokens into the converted asynchronous circuit by inserting the one or more additional tokens at an input before taking tokens from an output; and
   inserting tokens at the input and taking tokens from the output at a one-to-one ratio after inserting the one or more additional tokens at the input before taking tokens from the output.

2. The method of converting a synchronous circuit to an asynchronous circuit of claim 1, wherein inserting one or more additional tokens into the converted asynchronous circuit comprises initializing the circuit with the one or more additional tokens placed in the asynchronous circuit.

3. The method of converting a synchronous circuit to an asynchronous circuit of claim 1, wherein converting synchronous circuit logic to asynchronous circuit logic comprises converting at least one of inputs, outputs, registers, and flip-flops in the synchronous circuit to tokens in the asynchronous circuit.

4. An asynchronous circuit, comprising:
   an asynchronous logic network derived from a synchronous circuit design; and
   at least one additional token added into the converted asynchronous circuit, wherein the at least one additional token comprises one or more additional tokens inserted into an input of the converted asynchronous circuit before tokens are taken from an output, and wherein tokens are inserted at the input and taken at the output at a one-to-one ratio after the additional tokens inserted at an input before tokens are taken from an output.

5. The asynchronous circuit of claim 4, wherein the asynchronous logic network comprises at least one token converted from at least one of inputs, outputs, registers, and flip-flops in the synchronous circuit.

6. The asynchronous circuit of claim 4, wherein the at least one additional token comprises the one or more additional tokens placed in the asynchronous circuit during initialization of the asynchronous circuit.

7. The asynchronous circuit of claim 4, wherein the asynchronous logic network comprises a logic network in a Field Programmable Gate Array (FPGA).

8. A non-transitory machine-readable medium with instructions stored thereon, the instructions when executed operable to cause a computerized system to:
   convert synchronous circuit logic to asynchronous circuit logic;
   insert one or more additional tokens into the converted asynchronous circuit by inserting the one or more additional tokens at an input before taking tokens from an output; and
   insert tokens at the input and taking tokens from the output at a one-to-one ratio after inserting the one or more additional tokens at the input before taking tokens from the output.

9. The non-transitory machine-readable medium of claim 8, wherein inserting one or more additional tokens into the converted asynchronous circuit comprises initializing the circuit with the one or more additional tokens placed in the asynchronous circuit.

10. The non-transitory machine-readable medium of claim 8, wherein converting synchronous circuit logic to asynchronous circuit logic comprises converting at least one of inputs, outputs, registers, and flip-flops in the synchronous circuit to tokens in the asynchronous circuit.

* * * * *

UNITED STATES PATENT AND TRADEMARK OFFICE
CERTIFICATE OF CORRECTION

PATENT NO.         : 8,234,607 B2
APPLICATION NO.    : 12/559612
DATED              : July 31, 2012
INVENTOR(S)        : Ekanayake et al.

It is certified that error appears in the above-identified patent and that said Letters Patent is hereby corrected as shown below:

On the Title page, in column 1, in field (54), and in Column 1, line 2, "Title", delete "SYNCHONOUS" and insert --SYNCHRONOUS--, therefor In column 1, line 26, after "latch", insert --,--, therefor In column 1, line 27, after "signals", insert --,--, therefor In column 3, line 20, before "have", insert --to--, therefor In column 4, line 5, before "it", insert --as--, therefor In column 4, line 19, delete "that" and insert --which--, therefor In column 4, line 34, after "which", insert --,--, therefor In column 4, line 49, delete "k" and insert --'k'--, therefor In column 4, line 51, delete "k" and insert --'k'--, therefor In column 5, line 11, delete "a" and insert --'a'--, therefor In column 5, line 11, delete "b" and insert --'b'--, therefor In column 5, line 28, delete "a" and insert --'a'--, therefor In column 5, line 32, delete "b" and insert --'b'--, therefor In column 5, line 66, delete "b" and insert --'b'--, therefor Signed and Sealed this
Eighth Day of January, 2013

David J. Kappos
*Director of the United States Patent and Trademark Office*

CERTIFICATE OF CORRECTION (continued)
U.S. Pat. No. 8,234,607 B2

In column 6, line 7, delete "b" and insert --'b'--, therefor

In column 6, line 39, after "on", insert --,--, therefor

In column 6, line 39, delete "a", therefor

In column 6, line 41, delete "a" and insert --'a'--, therefor

In column 6, line 43, delete "b" and insert --'b'--, therefor

In column 6, line 47, delete "b" and insert --'b'--, therefor